(12) United States Patent
Kimoto et al.

(10) Patent No.: US 11,044,810 B2
(45) Date of Patent: Jun. 22, 2021

(54) STRETCHABLE WIRE MEMBER

(71) Applicant: SEKISUI POLYMATECH CO., LTD., Saitama (JP)

(72) Inventors: Takaya Kimoto, Saitama (JP); Tohru Kimura, Saitama (JP); Masamichi Ishikubo, Saitama (JP)

(73) Assignee: SEKISUI POLYMATECH CO., LTD., Saitama (JP)

( * ) Notice: Subject to any disclaimer, the term of this patent is extended or adjusted under 35 U.S.C. 154(b) by 0 days.

(21) Appl. No.: 16/763,438

(22) PCT Filed: Aug. 31, 2018

(86) PCT No.: PCT/JP2018/032361
§ 371 (c)(1),
(2) Date: May 12, 2020

(87) PCT Pub. No.: WO2019/142388
PCT Pub. Date: Jul. 25, 2019

(65) Prior Publication Data
US 2020/0321143 A1 Oct. 8, 2020

(30) Foreign Application Priority Data
Jan. 16, 2018 (JP) .............................. JP2018-004776

(51) Int. Cl.
*H05K 1/02* (2006.01)
*H05K 1/11* (2006.01)

(52) U.S. Cl.
CPC ........... *H05K 1/117* (2013.01); *H05K 1/0283* (2013.01)

(58) Field of Classification Search
CPC .............................. H05K 1/0283; H05K 1/117
See application file for complete search history.

(56) References Cited

U.S. PATENT DOCUMENTS

| 2012/0026700 A1 | 2/2012 | Furuta et al. | |
| 2014/0011390 A1* | 1/2014 | Hasegawa | H01R 12/62 439/371 |
| 2017/0099730 A1* | 4/2017 | Iwase | H05K 1/0393 |

FOREIGN PATENT DOCUMENTS

| DE | 102010034718 A1 | 2/2012 |
| JP | 2012-033316 A | 2/2012 |

(Continued)

OTHER PUBLICATIONS

International Search Report for PCT Patent App. No. PCT/JP2018/032361 (dated Nov. 13, 2018).

*Primary Examiner* — Hoa C Nguyen
(74) *Attorney, Agent, or Firm* — Cermak Nakajima & McGowan LLP; Tomoko Nakajima

(57) ABSTRACT

A stretchable wire member includes a base body in which a fixed wire is formed on a hard base material, and a stretching body in which a flexible wire is formed at a flexible base material. In the stretchable wire member in which the base body and the stretching body are fixed and connected to each other, the hard base material includes a projecting part that reduces concentration of stress that is generated at a boundary between the base body and the stretching body, and an upper surface and a lower surface of the projecting part and an upper surface and a lower surface of a recessed part surrounded by the projecting part are covered by a base-body-side flexible base material extending from the stretching body.

13 Claims, 9 Drawing Sheets

(56) References Cited

FOREIGN PATENT DOCUMENTS

| | | |
|---|---|---|
| JP | 2013-145661 A | 7/2013 |
| JP | 2016-076531 A | 5/2016 |
| JP | 2016-219543 A | 12/2016 |

* cited by examiner

STRETCHABLE WIRE MEMBER

This application is a national phase entry under 35 U.S.C. § 371 of PCT Patent Application No. PCT/JP2018/032361, filed on Aug. 31, 2018, which claims priority under 35 U.S.C. § 119 to Japanese Patent Application No. 2018-004776, filed Jan. 16, 2018, both of which are incorporated by reference.

TECHNICAL FIELD

The present invention relates to a stretchable wire member whose flexible base material is provided with a flexible wire and that can be used by being stretched and contracted.

BACKGROUND ART

In recent years, wearable devices, such as smart watches and activity meters having a sensor for measuring movements of the body, such as the number of steps taken, and pulse monitors, are being widely developed. However, since such existing wearable devices use a unit in which a semiconductor element is disposed on a hard and rigid substrate, and the unit does not follow movements of the body, the wearable devices are not comfortable to wear. Therefore, technologies that provide flexible wearable devices by forming a conductive circuit in an elastic body or clothes are being developed. Such technologies are described in, for example, Japanese Unexamined Patent Application Publication No. 2016-076531 (Patent Literature 1), Japanese Unexamined Patent Application Publication No. 2012-033316 (Patent Literature 2), and Japanese Unexamined Patent Application Publication No. 2013-145661 (Patent Literature 3).

CITATION LIST

Patent Literature

PTL 1: Japanese Unexamined Patent Application Publication No. 2016-076531
PTL 2: Japanese Unexamined Patent Application Publication No. 2012-033316
PTL 3: Japanese Unexamined Patent Application Publication No. 2013-145661

SUMMARY OF INVENTION

Technical Problem

However, although Japanese Unexamined Patent Application Publication No. 2016-076531 (Patent Literature 1) describes a technology of a composite module that is applicable to, for example, a wearable terminal and that has excellent stretchability and shock resistance, a substrate is three-dimensionally placed on a body part, which stretches, via conductive connecting bodies, so that, when the body part is stretched and the interval between the connection bodies is increased, the body part may be removed from the substrate. Therefore, even if the composite module is said to be stretchable, the composite module can only provide a small stretching ratio of approximately a few %.

Although Japanese Unexamined Patent Application Publication No. 2012-033316 (Patent Literature 2) describes a structure in which a connection part is directly fixed to a flexible base material, when a flexible wire body is largely stretched, stress concentrates at a boundary portion between an electrical circuit and the wire body, so that the wire is largely stretched. Therefore, in usages in which stretching and contraction are large, the problem of wire breakage still remains.

Further, although Japanese Unexamined Patent Application Publication No. 2013-145661 (Patent Literature 3) describes a wire body connection structural body in which a polyester second wire body is connected to an elastomer first wire body, stress concentrates at a protruding part of the second wire body. Therefore, excessive load occurs at a flexible base material that exists near the protruding part, and, thus, the flexible base material may be distorted or peeling may tend to occur between the flexible base material and the protruding part.

It is an object of the present invention to provide a stretchable wire member that includes a hard portion and a flexible portion that are connected to each other. The stretchable wire member is a member that, in addition to preventing wire breakage at a boundary between the hard portion and the flexible portion, allows a load that is applied to the flexible portion as a result of being stretched to be small.

Solution to Problem

To this end, the present invention provides a stretchable wire member including a base body in which a fixed wire is formed on a hard base material and a stretching body in which a flexible wire is formed at a flexible base material, wherein, in the stretchable wire member in which the base body and the stretching body are fixed and connected to each other, the hard base material includes a projecting part that reduces concentration of stress that is generated at a boundary between the base body and the stretching body, and an upper surface and a lower surface of the projecting part and an upper surface and a lower surface of a recessed part surrounded by the projecting part are covered by a base-body-side flexible base material extending from the stretching body.

The stretchable wire member includes a base body in which a fixed wire is formed on a hard base material and a stretching body in which a flexible wire is formed at a flexible base material, wherein, in the stretchable wire member in which the base body and the stretching body are fixed and connected to each other, the hard base material includes a projecting part that reduces concentration of stress that is generated at a boundary between the base body and the stretching body, and an upper surface and a lower surface of the projecting part and an upper surface and a lower surface of a recessed part surrounded by the projecting part are covered by a base-body-side flexible base material extending from the stretching body. Therefore, both the upper surface and the lower surface of the projecting part can be subjected to stress at the projecting part by covering the upper surface and the lower surface of the projecting part by the flexible base material. Consequently, compared to an existing structure in which one surface is subjected to stress, it is possible to reduce the load on the flexible base material to ½, and to suppress distortion of the flexible base material near stress concentration locations of the flexible base material and the projecting part, and to suppress peeling of the flexible base material and the projecting part.

According to the present invention, a bulging part may be provided on an outer side with respect to a distal end of the projecting part, the bulging part being formed from a flexible base material and bulging outward in a direction opposite to a central portion where the flexible wire is provided. Since a bulging part is provided on an outer side with respect to a distal end of the projecting part, the bulging part being formed from a flexible base material and bulging outward in a direction opposite to a central portion where the flexible wire is provided, it is possible to fix the outer side surface of the projecting part to the bulging part, which is made of a flexible material, and to reduce the concentration of stress that is generated between the projecting part and the flexible base material. Therefore, it is possible to further suppress distortion of the flexible base material near stress concentration locations of the flexible base material and the projecting part, and to further suppress peeling of the flexible base material and the projecting part.

According to the present invention, the projecting part may have a shape whose perpendicular distance from the flexible wire becomes larger with decreasing distance from the distal end. Since the projecting part has a shape whose perpendicular distance from the flexible wire becomes larger with decreasing distance from the distal end, it is possible to suppress the flexible wire from being locally largely stretched and contracted by moving the distal end of the projecting part where stress tends to concentrate away from the flexible wire. The distal end of the projecting part is a portion that is ordinarily located farthest from connection parts which are connected to other members, and that is stretched by the largest amount in a stretching-and-contraction direction of the stretchable wire member.

According to the present invention, a front and a back (a top and a bottom) of the flexible wire are covered by the flexible base material, and a rubber hardness of the flexible wire is higher than a rubber hardness of the flexible base material. Since a front and a back of the flexible wire are covered by the flexible base material, and a rubber hardness of the flexible wire is higher than a rubber hardness of the flexible base material, it is possible to stabilize the resistance value when the stretchable wire member is compressed, and to prevent breakage of the flexible wire during manufacture.

According to the present invention, the upper surface of the projecting part of the hard base material may have a curved shape that is inclined with respect to an upper surface where the fixed wire is stacked. Since the upper surface of the projecting part of the hard base material has a curved shape that is inclined with respect to an upper surface where the fixed wire is stacked, when the stretchable wire member is stretched, it is possible to reduce stress in a diameter decreasing direction while increasing the curvature of the curve. Therefore, by reducing stress on the projecting part, it is possible to suppress distortion of the flexible base material near stress concentration locations of the flexible base material and the projecting part, and to suppress peeling of the flexible base material and the projecting part.

According to the present invention, a fixing strength between the flexible wire and the flexible base material may be larger than a tensile rupture force of the flexible wire. Since a fixing strength between the flexible wire and the flexible base material is larger than a tensile rupture force of the flexible wire, even if the stretchable wire member is largely stretched, the flexible wire is unlikely to be peeled from the flexible base material.

According to the present invention, of the base-body-side flexible base material, which is a flexible base material that is stacked on the base body, a portion of the flexible base material that is fixed to an upper surface of the hard base material may be more flexible that a portion of the flexible base material that is fixed to a lower surface of the hard base material. Since of the base-body-side flexible base material, which is a flexible base material that is stacked on the base body, a portion of the flexible base material that is fixed to an upper surface of the hard base material is more flexible that a portion of the flexible base material that is fixed to a lower surface of the hard base material, when, for example, the hard base material is sandwiched and press-contacted by the base-body-side flexible base material from above and below the hard base material during manufacturing of the stretchable wire member, the base-body-side flexible base material on the side including a conductive wire can be more easily deformed. Therefore, it is possible to present breakage of the flexible wire.

According to the present invention, a width of an end portion of the hard base material on a side opposite to a connection side where the hard base material is connected to the stretching body may be smaller than a width of the projecting part. Since a width of an end portion of the hard base material on a side opposite to a connection side where the hard base material is connected to the stretching body is smaller than a width of the projecting part, it is possible to curve the entire stretchable wire member when the stretchable wire member is stretched and to make it unlikely for the conductive wire to break by dispersing the stress.

According to the present invention, a width of an end portion of the hard base material on a side opposite to a connection side where the hard base material is connected to the stretching body may be substantially equal to a width of the projecting part. Since a width of an end portion of the hard base material on a side opposite to a connection side where the hard base material is connected to the stretching body is substantially equal to a width of the projecting part, by fixing the end portion of the hard base material on the side opposite to the side where the hard base material is connected to the stretching body, it is possible to stretch the stretchable wire member without curving the stretchable wire member when the stretchable wire member is stretched.

Advantageous Effects of Invention

According to the stretchable wire member of the present invention, even if the stretchable wire member is stretched, breakage and deterioration of the flexible base material at stress concentration locations are unlikely to occur, and peeling between the flexible base material and the hard base material is unlikely to occur.

DESCRIPTION OF EMBODIMENTS

Figure 1A:
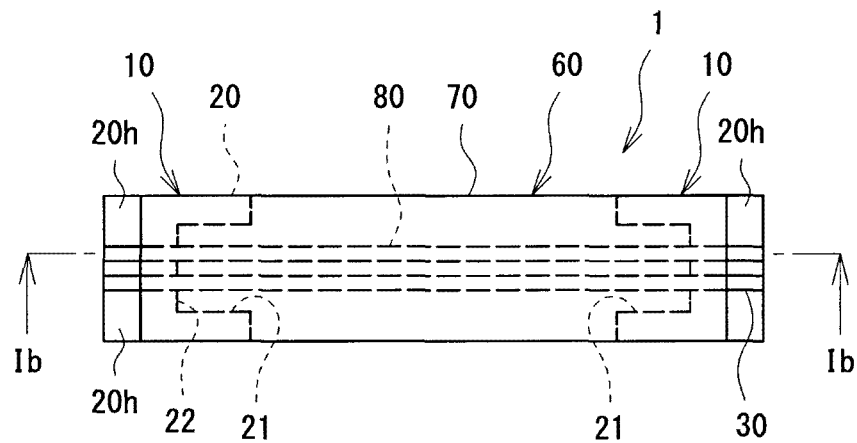
FIG. 1 is an explanatory view of a stretchable wire member of a first embodiment, with FIG. 1(a) being a schematic plan view thereof and FIG. 1(b) being a sectional view along line Ib-Ib in FIG. 1(a).

Stretchable wire members according to embodiments of the present invention are described in detail. Parts, materials, manufacturing methods, operational effects, functions, etc. that are the same in the embodiments are not repeated.

First Embodiment [FIGS. 1 to 4]

As shown in FIGS. 1 to 4, a stretchable wire member 1 of a first embodiment includes base bodies 10, in which fixed wires 30 are formed on hard base materials 20, and a stretching body 60, in which flexible wires 80 are formed at a flexible base material 70. Each base body 10 and the stretching body 60 are fixed to and integrated with one another other by covering an upper surface 21a and a lower surface 21b of each projecting part 21 of each base body 10 and an upper surface 22a and a lower surface 22b of each recessed part 22, positioned on an inner side of the projecting parts 21 so as to be surrounded by the projecting parts 21, with a base-body-side flexible base material 40 extending from the stretching body 60. Wires of the base bodies 10 and the stretching body 60 are connected to each other by extending a base-body-side flexible wire 50 extending from the flexible wires 80 of the stretching body 60 to a location on the fixed wires 30. The wording used when expressing upper and lower sides in the present description and in the claims is used for convenience of explanation and does not limit the meaning of upper and lower sides when using the stretchable wire member 1.

Each base body 10 is a part that is connected to, for example, an existing wire of, for example, a flexible printed wiring board, and is a wiring substrate that has the fixed wires 30 formed on the hard base materials 20 and that has a certain rigidity. By covering end portions of the hard base materials 20 by the base-body-side flexible base material 40, each base body 10 is joined to the stretching body 60.

Each hard base material 20 has a sheet form made of a hard material, and is a member having a rigidity that substantially does not allow the member to stretch and contract in an in-plane direction of the sheet. In contrast, in a direction perpendicular to a sheet surface, each hard base material 20 may or may not be easily deformed. Examples of hard materials having such properties include insulating hard materials, such as flexible resin films, hard resin substrates, and ceramic substrates. Of these, flexible resin films have the property of being easily deformed in a direction perpendicular to a sheet surface substantially without stretching and contracting in the in-plane direction of the sheet. On the other hand, hard resin substrates and ceramic substrates are unlikely to be deformed even in a direction perpendicular to a sheet surface substantially without stretching and contracting in the in-plane direction of the sheet. Among these, polyimide films, phenol resin, and epoxy resin, which are used as base materials of printed wires, are desirably used.

For each hard base material 20, conductive hard materials may be used in addition to insulating hard materials. However, when the plurality of fixed wires 30 or flexible wires 80 are directly provided on a conductive hard material, a problem in that the fixed wires 30 or the flexible wires 80 (described later) become electrically connected to each other via each conductive hard base material 20 occurs. Therefore, in order to prevent this problem from occurring, it is necessary to, for example, interpose an insulating film on a surface of the conductive hard material or provide a conductive covering on a surface of each fixed wire 30 or each flexible wire 80 to prevent the conductive hard base materials 20 and the fixed wires 30 or the flexible wires 80 from being directly electrically connected to each other. Examples of conductive materials include metals and conductive resins.

Although the fixed wires 30 are stacked on central portions of the hard base materials 20, outer portions in a direction orthogonal to the fixed wires 30 are provided with the projecting parts 21 projecting in an extending direction of the fixed wires 30 from the end portions of the hard base materials 20. The base-body-side flexible base material 40 extending from the stretching body 60 is fixed to a distal-end side surface 21e, the upper surface 21a, the lower surface 21b, and an inner side surface 21c, which is a side surface on the side of the fixed wires 30, of each projecting part 21.

In this way, the projecting parts 21 are positioned at outer positions in a direction orthogonal to the extending direction of the flexible wires 80 in plan view so as to project in the extending direction of the conductive wires 30 and 80 beyond boundaries of the fixed wires 30 of the base bodies 10 and the flexible wires 80 of the stretching body 60.

The fixed wires 30 that are formed on the hard base materials 20 may be, for example, a good-conductivity metal layer, such as a copper layer, a nickel layer, or an aluminum layer, or a conductive resin layer in which any of the good-conductivity metal layers in the form of powder is dispersed in resin. Of these, for example, when soldered to wires or when repeatedly connected to a connector, which is a connection target, it is desirable to use a good-conductivity metal layer having high wear resistance. The base-body-side flexible wire 50 extending from the flexible wires 80 of the stretching body 60 is stacked on the fixed wires 30 on a connection end side of the base materials 10 where the base materials 10 are connected to the stretching body 60, and the conductive wires 30 of the base materials 10 and the conductive wires 80 of the stretching body 60 are in conductive connection with each other via the stacking portion. On the other hand, a side of each base body 10 opposite to the connection end, where each base body 10 is connected to the stretching body 60, is where the fixed wires 30 are exposed to the outside and is a fixed part 20h that is connected to other members, such as a connector, a cable, or an electronic element. The shapes of the fixed wires 30 are not particularly limited, and can be any shapes.

The stretching body 60 has the flexible wires 80 formed at the flexible base material 70 and is a wiring substrate having certain flexibility, and is joined to the base bodies 10 by covering the end portions of the hard base materials 20 with the flexible base material 70 extending from the stretching body 60.

The flexible base material 70 is a member made of a flexible material and is stretchable. As flexible materials, in addition to thermosetting rubber and thermoplastic elastomer, fabrics, such as woven fabrics or knit fabrics, or a combination of these fabrics can be used. It is desirable to use materials that are stretchable to a length that is at least greater than or equal to 120% of their original length. It is more desirable to use materials that are stretchable to a length that is greater than or equal to 150% of their original length. When, of these materials, thermosetting rubber or thermoplastic elastomer is used, it is desirable that the rubber hardness prescribed in JIS K6253 be A hardness and be less than or equal to 90 (hereafter referred to as A90). This is because, if the rubber hardness exceeds A90, the stress when the material is stretched becomes unnecessarily large and the probability of peeling is increased. On the other hand, although there is particularly no lower limit to the rubber hardness, when the rubber hardness is E hardness and is less than 20, problems may occur in some usages due to the wear resistance and tensile rupture stress being low. The flexible base material 70 forms the base of a structural portion of the stretching body 60, extends towards the sides of the base materials 10 from the stretching body 60, and forms a part of each base body 10 at a portion where the flexible base material 70 is stacked on the hard base material 20 of each base body 10.

The shape of the flexible base material 70 that constitutes the stretching body 60 can typically be a rectangular belt shape or a rod shape. A portion near where the flexible base material 70 is fixed to each hard base material 20 that constitutes each base body 10 can be made wider. By causing the vicinity with respect to each hard base material 20 to be wide, it is possible to reduce the stretching ratio of the flexible base material 70 near the boundaries between the conductive wires 30 of the base bodies 10 and the conductive wires 80 of the stretching body 60.

The flexible wires 80 constitute, along with the flexible base material 70, the stretching body 60, and are stretchable. By providing the base bodies 10 on two sides of the stretching body 60, the fixed wires 30 of the base bodies 10 provided on the two sides of the stretching body 60 are electrically connected to each other by the flexible wires 80, and even if the intervals between the fixed wires 30 change, it is possible to maintain conductive connection states of the fixed wires. For the flexible wires 80, stretchable conductive materials are used. Specifically, it is desirable to use flexible conductive resins in which conductive particles are dispersed in thermosetting rubber or thermoplastic elastomer. When thermosetting rubber or thermoplastic elastomer is used as the flexible base material 70, it is desirable to form the flexible wires 80 by using a flexible conductive resin in which carbon powder or silver of the same type of resin is dispersed. This is because the fixability between the flexible base material 70 and the flexible wires 80 is increased.

Since the flexible wires 80 and the flexible base material 70 are formed of flexible materials, although they can have the same hardness, the hardness of the flexible wires 80 can be made higher than the hardness of the flexible base material 70. When the stretchable wire member 1 is constituted with such a hardness relationship, even if the stretchable wire member 1 is compressed, the flexible base material 70 is easily compressed and deformed, whereas the flexible wires 80 are unlikely to be compressed and deformed. Therefore, since the flexible wires 80 are unlikely to undergo changes in volume when they are compressed, a stable resistance value can be exhibited in usages in which they are subjected to pressure in directions other than the extending direction. When the stretchable wire member 1 is being manufactured, even if the flexible wires 80 are press-contacted by the flexible base material 70 from both sides thereof, the flexible base material 70 is unlikely to be deformed, so that it is possible to prevent breakage of the flexible wires 80.

It is desirable that the fixing strength between the flexible wires 80 and the flexible base material 70 be larger than the tensile rupture force of the flexible wires 80. This is because, if, in contrast, the tensile rupture force of the flexible wires 80 is greater than the fixing strength between the flexible wires 80 and the flexible base material 70, the flexible wires 80 may peel from the flexible base material 70 when the stretchable wire member 1 is largely stretched. Although ordinarily such problems do not occur, when the stretchable wire member 1 is especially flexible and is stretched by more than 200%, the flexible wires 80 themselves are largely deformed in a diameter decreasing direction, so that, since stress is generated between the flexible wires 80 and the flexible base material 70, peeling tends to occur.

To overcome such problems, by reducing the tensile rupture force of the flexible wires 80, portions of the flexible wires 80 can be made to crack before being peeled. Although such cracks that are small and fine are formed, and the resistance value increases, the more the flexible wires 80 are cut, the less likely the cracks become large cracks. Therefore, while suppressing peeling, it is also possible to suppress breakage of the flexible wires 80, and, by monitoring the increase in the resistance value, it is possible to sense stretching limits. The relationship between the fixing strength and the tensile rupture force above can be determined by performing a stretching test of the stretchable wire member 1 and determining whether or not cracks are produced before peeling. That is, when peeling has occurred before cracks are produced in the stretching test, it can be determined that the tensile rupture force of the flexible wires 80 is greater than the fixing strength between the flexible wires 80 and the flexible base material 70, whereas, when cracks are produced in portions of the flexible wires 80 before peeling, it can be determined that the fixing strength between the flexible wires 80 and the flexible base material 70 is greater than the tensile rupture force of the flexible wires 80.

The method of fixing the base-body-side flexible base material 40, which is a flexible base material provided on the side of the base bodies 10, and each hard base material 20 to one another can be, for example, a method that uses the adhesiveness of the materials themselves, a method that uses an adhesive or the like, a method that uses thermal bonding, or a fixing method that is based on structural fixing. An example of a material that can make use of adhesiveness can include thermosetting rubber in a semi-cured state. An example of a material that allows fixing by thermal bonding can include thermoplastic elastomer or thermoplastic fabric. When structural fixing is used, for example, fixing based on a fitting structure such as a hook-and-loop fastener or fixing based on sewing can be performed.

Of the base-body-side base material 40, which is a flexible base material that is stacked on the base bodies 10, it is desirable that a portion of the base-body-side flexible base material 40 that is fixed to an upper surface 20a of each hard base material 20 be more flexible than a portion of the base-body-side flexible base material 40 that is fixed to a lower surface 20b of each hard base material 20. In manufacturing the stretchable wire member 1, when fixing the flexible base material 70 to each hard base material 20, portions of the flexible base material 70 on the sides where the conductive wires 50 and 80 are provided can be more easily deformed, so that it is possible to suppress breakage of the conductive wires 50 and 80.

Although, in the stretchable wire member 1, the end portions of the hard base materials 20 are fixed and supported by, for example, other wire members, and the stretching body 60 is stretched and contracted, the fixed parts 20h that are fixed and supported by the other wire members are parts that serve as starting points of stretching of the stretchable wire member 1, and are desirably fixed up to both widthwise outer ends of the stretchable wire member 1. This is because, by fixing the fixed parts 20h up to the outer ends of the stretchable wire member 1, it is possible to minimize stress that is applied to a connection portion of the fixed wires 30 that are connected to, for example, the other wire members.

Figure 3:
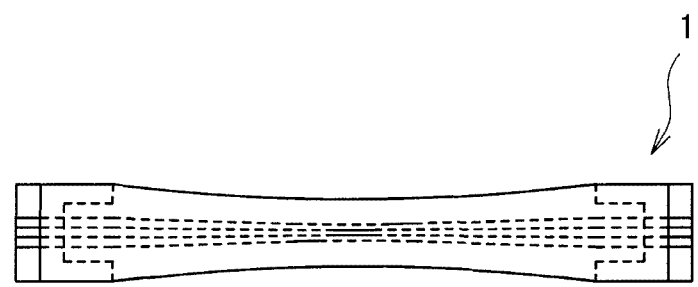
FIG. 3 is a schematic plan view illustrating a state in which the stretchable wire member in FIG. 1 has been stretched.
Figure 4:
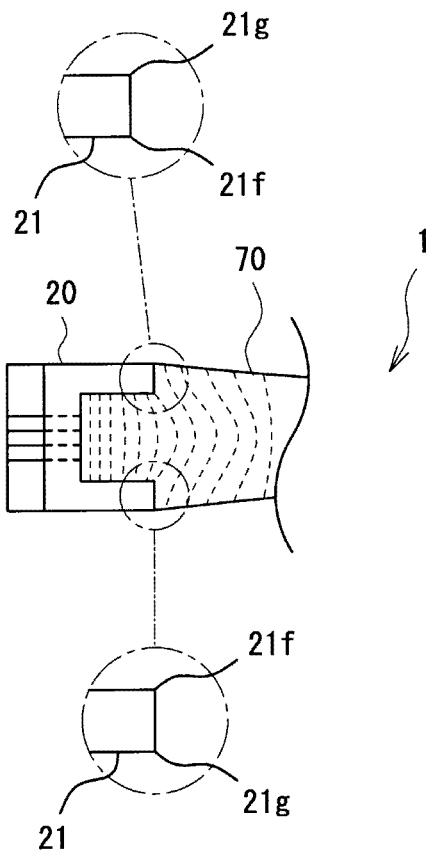
FIG. 4 is an explanatory view illustrating a state of stretching near a boundary between the base body and a stretching body of the stretchable wire member in FIG. 1.

When such a stretchable wire member 1 is stretched, typically, as shown in FIG. 3, whereas a central portion of the flexible base material 70 of the stretching body 60 becomes thinner, each base body 10 has its shape unchanged and is maintained in its initial state. Even if a boundary portion between each base body 10 and the stretching body 60 is observed with attention, the stretching of the flexible base material 70 is observed. FIG. 4 shows a state in which linear marks provided at equal intervals at the boundary portion between the stretching body 60 and each base body 10 are stretched and are wavy. As shown in FIG. 4, stretching of the flexible base material 70 at each recessed part 22 surrounded by the two projecting parts 21 and 21 is suppressed. Stress concentrates at distal-end inner corner parts (inner corner parts) 21f and distal-end outer corner parts (outer corner parts) 21g of the projecting parts 21 and 21.

Since, by the two projecting parts 21 and 21, stretching of the flexible base material 70 and the flexible wires 80 at the recessed parts 22 on the inner sides of the projecting parts 21 and 21 is suppressed, it is possible to prevent breakage of the flexible wires 80 near the boundary with respect to the base bodies 10.

Even if the portions of the flexible base material 70 that are fixed to the hard base materials 20 are stretched, since the portions are fixed, stress concentrates at distal ends T of the projecting parts 21 when the stretching body 60 is stretched. At this time, since stretching of the central portion of the flexible base material 70 is suppressed by stress relaxation of the material, in the vicinity of the distal-end inner corner parts 21f, a portion where the stretching amount is large and a portion where the stretching amount is small are close to each other, so that here a large distortion tends to occur in the flexible base material. On the other hand, since the stretching amount of the distal-end outer corner parts 21g is larger than the stretching amount of the distal-end inner corner parts 21f, stress is large.

Figure 5:
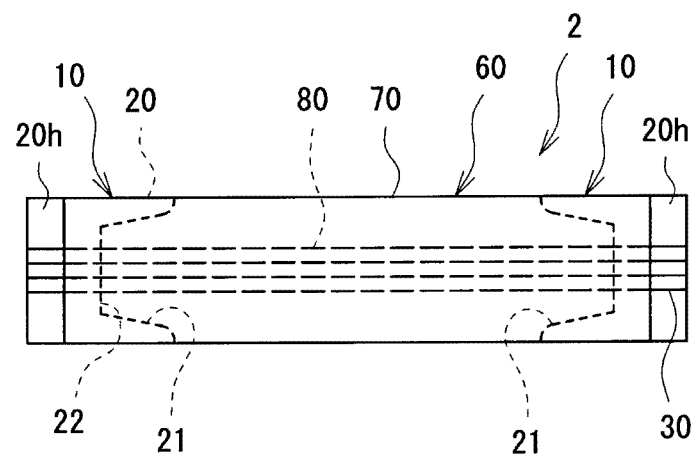
FIG. 5 is an explanatory view of a stretchable wire member of a second embodiment, and is a schematic plan view corresponding to FIG. 1(a).
Figure 6:
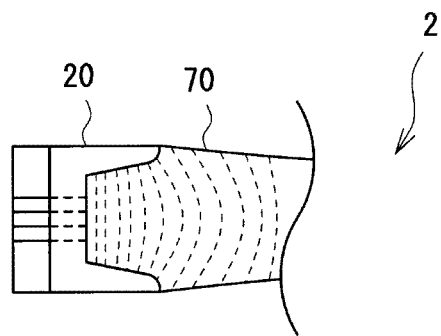
FIG. 6 is an explanatory view illustrating a state of stretching near a boundary between a base body and a stretching body of the stretchable wire member in FIG. 5.

Second Embodiment [FIGS. 5 to 6]

As shown in FIGS. 5 and 6, a stretchable wire member 2 of a second embodiment has a feature that projecting parts 21 of hard base materials 20 have a shape that, with decreasing distance from distal ends T, widens so that the distance from flexible wires 80 increases. It is desirable that the widening shape be such that the distance between the projecting parts 21 and the flexible wires 80 increases with increasing distance in an extending direction of the wires from a boundary between fixed wires 30 of each base body 10 and the flexible wires 80 of a stretching body 60.

Since the projecting parts 21 having a widening shape, compared to when the projecting parts 21 do not have a widening shape, it is possible to reduce the concentration of stress generated at distal-end inner corner parts 21f and to suppress the flexible wires 80 from being locally largely stretched.

Figure 7:
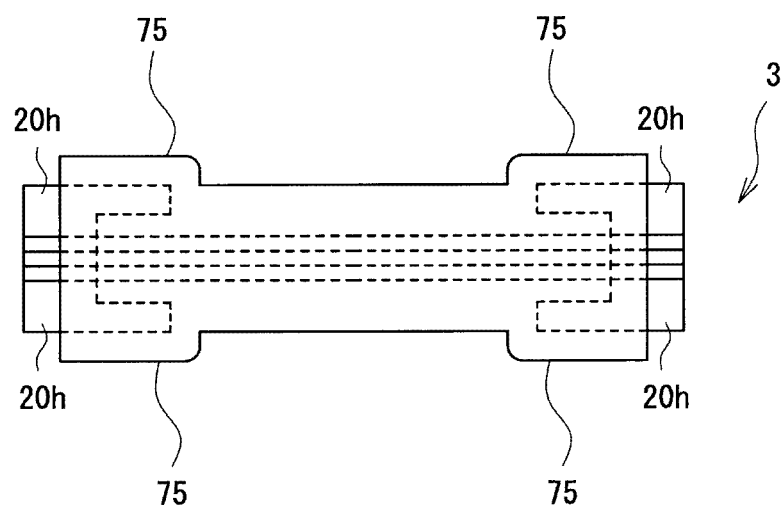
FIG. 7 is an explanatory view of a stretchable wire member of a third embodiment, and is a schematic plan view corresponding to FIG. 1(a).

Third Embodiment [FIG. 7]

FIG. 7 is a plan view of a stretchable wire member 3 of a third embodiment. The stretchable wire member 3 differs from the stretchable wire member 1 described in the previous embodiment in that, at distal ends T of projecting parts 21, bulging parts 75 that bulge outward in a direction opposite to a central portion where flexible wires 80 are provided are provided.

The bulging parts 75 are fixed to outer side surfaces 21d of the projecting parts 21. When the stretchable wire member 3 is stretched, the bulging parts 75 cover distal-end outer corner parts 21g, whose deformation amount is increased, to reduce concentration of stress near the distal-end outer corner parts 21g, so that it is possible to suppress distortion of a flexible base material 70 near stress concentration locations of the flexible base material 70 and the projecting parts 21, and to suppress peeling of the flexible base material 70 and the projecting parts 21.

To be a little more specific, when the stretchable wire member is stretched, the flexible base material 70 is deformed so as to become elongated towards the center. Therefore, the deformation amount of peripheral portions is larger than the deformation amount of the central portion. When the flexible wires 80 are disposed in the center, the projecting parts 21 are inevitably disposed at outer sides 10d. In the structure in which the projecting parts 21 disposed at the outer sides 10d are fixed to the peripheral portions of the flexible base material 70, stress that is applied to the distal-end outer corner parts 21g, which are outermost ends of this fixing portion, becomes the largest.

On the other hand, by forming the bulging parts 75, made of flexible materials, at regions that become the outer sides 10d with respect to the projecting parts 21 and by fixing the bulging parts 75 to the outer side surfaces 21d of the projecting parts 21, it is possible to prevent this fixing portion from being the outermost ends of the flexible base material and to increase the area of fixing with the outer side surfaces 21d of the projecting parts 21. Therefore, it is possible to reduce concentration of stress between the projecting parts 21 and the flexible base material 70, and to further suppress distortion of the flexible base material 70 near stress concentration locations of the flexible base material 70 and the projecting parts 21, and to further suppress peeling of the flexible base material 70 and the projecting parts 21.

Figures 8A, 8B:
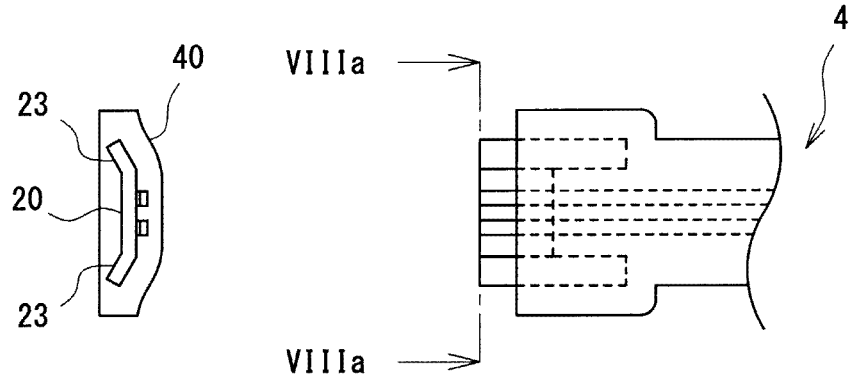
FIG. 8 is an explanatory view of a stretchable wire member of a fourth embodiment, with FIG. 8(a) being a schematic plan view corresponding to FIG. 2(a) and FIG. 8(b) being an end view along line VIIIB-VIIIB in FIG. 8(a).

Fourth Embodiment [FIGS. 8 and 9]

FIG. 8 shows a stretchable wire member 4 of a fourth embodiment. Although, the stretchable wire member 4 of the fourth embodiment has substantially the same shape as the stretchable wire member 1 described in the first embodiment in plan view, the stretchable wire member 4 includes differently shaped hard base materials 20 and a differently shaped flexible base material 70 in sectional view.

Figures 9A, 9B:
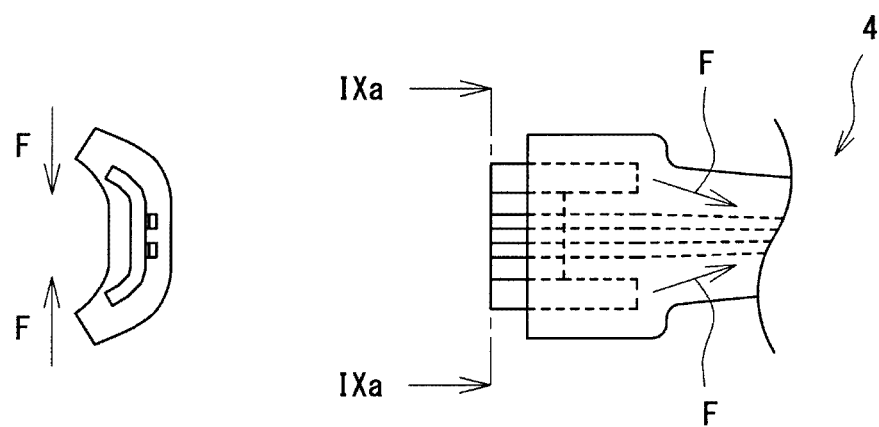
FIG. 9 is an explanatory view illustrating a state in which the stretchable wire member in FIG. 8 has been stretched, with FIG. 9(a) being a schematic plan view corresponding to FIG. 8(a) and FIG. 9(b) being an end view along line IXB-IXB in FIG. 9(a).

In the stretchable wire member 4, including portions of projecting parts 21 of hard base materials 20, outer parts 23 of the hard base materials 20 are curved downward. The flexible base material 70 has an upper surface that follows the hard base materials 20 to have a curved shape. Since the stretchable wire member 4 has a downwardly curved shape, when the stretchable wire member 4 is stretched, the stretchable wire member 4 exhibits a different deformation behavior. Compared to the stretchable wire part 1 whose hard base materials 20 are flat, since the stretchable wire member 1 including the hard base materials 20 having a planar shape has a high rigidity in an in-plane direction, each hard base material 20 is substantially not deformed with respect to stress that is generated when the stretchable wire member 1 is stretched. In contrast, since the stretchable wire member 4 of the present embodiment includes the hard base materials 20 that are three-dimensionally formed, as shown in FIG. 9 that shows a state in which the stretchable wire member 4 has been stretched, a stress F that is generated by the stretchable wire member 4 has an angle in the plane of the hard base materials 20. Therefore, by the stress F, each hard base material 20 is curved, and, as shown in FIG. 9(b), is deformed as if each hard base material 20 is rounded with a large curvature. By such a deformation, stress that is applied to distal ends T of the projecting parts 21 of the hard base materials 20 is reduced to make it possible to suppress distortion of the flexible base material 70 near stress concentration locations of the flexible base material 70 and the projecting parts 21, and to suppress peeling of the flexible base material 70 and the projecting parts 21.

Figure 11A:
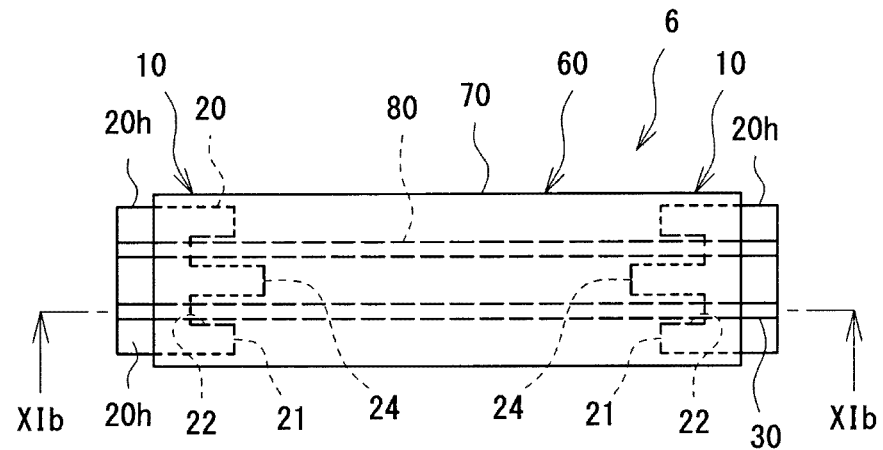
FIG. 11 is an explanatory view of a stretchable wire member of a fifth embodiment, with FIG. 11(a) being a schematic plan view thereof and FIG. 11(b) being a sectional view along line XIb-XIb in FIG. 11(a).
Figure 11B:
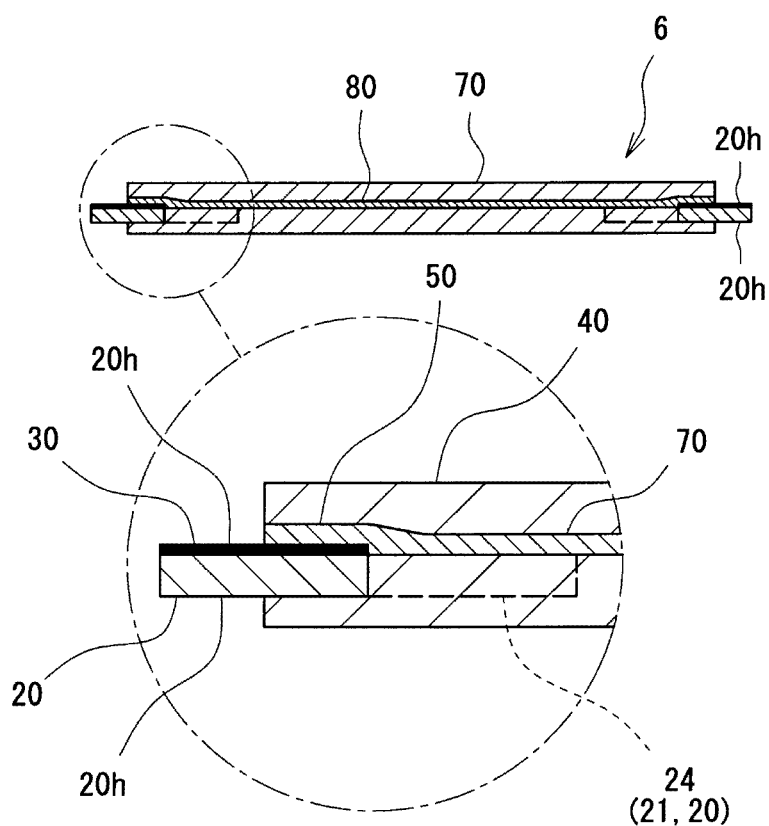

Fifth Embodiment [FIG. 11]

FIG. 11 shows a stretchable wire member 6 of a fifth embodiment. The stretchable wire member 6 of the fifth embodiment differs from, for example, the stretchable wire member 1 described in the previous embodiment in that different projecting parts 21 are provided at recessed parts 22 surrounded by the projecting parts 21 of, for example, the stretchable wire member of the first embodiment.

In the present embodiment, central projecting parts 24, which are the different projecting parts 21, are each provided between two flexible wires 80 and each have a shape protruding more in an extending direction than the two projecting parts 21 provided on outer sides. The central projecting parts 21 reduce concentration of stress near distal-end outer corner parts 21g where the deformation amount is increased when the stretchable wire member 6 is stretched, to make it possible to suppress distortion of a flexible base material 70 near stress concentration locations of the flexible base material 70 and the projecting parts 21, and to suppress peeling of the flexible base material 70 and the projecting parts 21.

The above-described embodiments are exemplifications of the present invention. Within a scope that does not depart from the spirit of the present invention, for example, the embodiments may be changed, may have publicly known technologies added thereto, or may be combined; and these technologies are also included in the scope of the present invention.

Figures 10A, 10B, 10C, 10D, 10E:
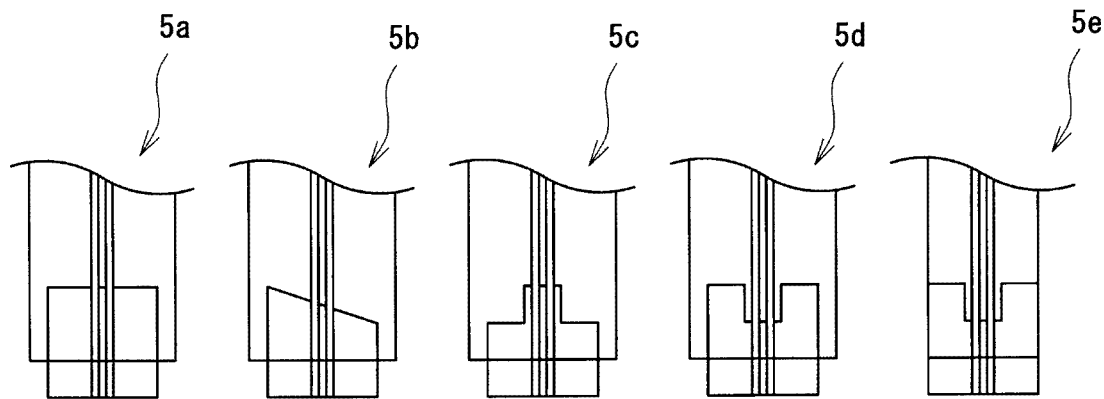
FIG. 10 is an explanatory view of modifications of stretchable wire members, with FIGS. 10(a) to 10(o) illustrating respective modifications.
Figures 10F, 10G, 10H, 10I, 10J:
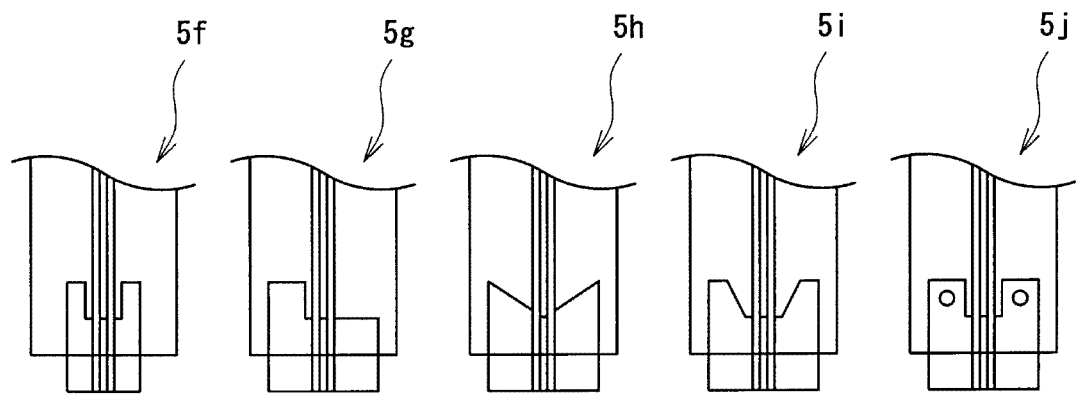
Figures 10K, 10L, 10M, 10N, 10O:
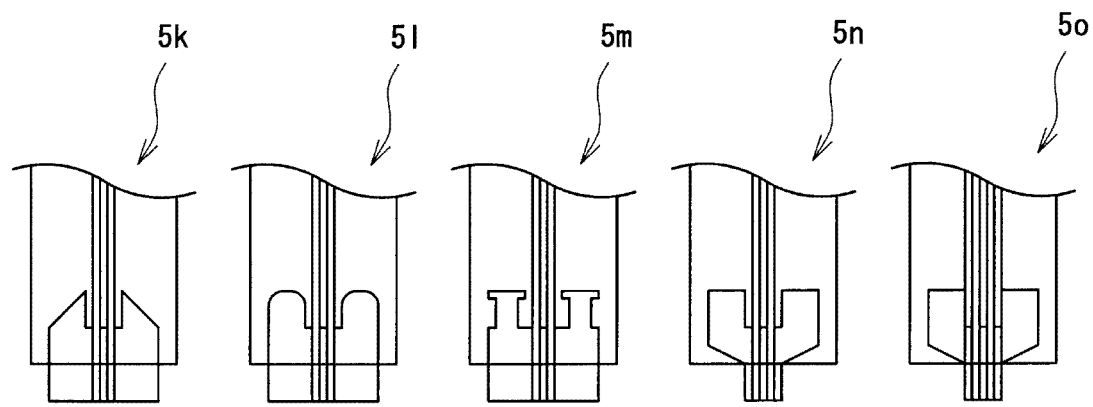

FIGS. 10(a) to 10(o) show various types of stretchable wire members 5 (5a to 5o) in which the shapes of hard base materials 20 are modified. In FIGS. 10(a) to 10(o), in order to make it easier to see the shapes of the hard base materials 20, a portion that is hidden by a base-body-side flexible base material 40 is also indicated by solid lines. Of such stretchable wire members 5, for example, the stretchable wire member 5m shown in FIG. 10(m) is such that distal ends T of projecting parts 21 are widened, and has an advantage that stress that is applied to the distal ends T of the projecting parts 21 is easily dispersed. In the stretchable wire member 5n shown in FIG. 10(n) and the stretchable wire member 5o shown in FIG. 10(o), a fixed-part-20h side of a hard base material 20 becomes thinner, and the entire stretchable wire members 5n and 5o are easily curved when stretched.

Although, in the stretchable wire member 4 in the fourth embodiment, the flexible base material 70 is also made to follow the hard base materials 20 to have a shape in which the upper surface of the flexible base material 70 is curved, the shape is not limited to such a shape. The hard base materials 20 can be curved, or the flexible base material 70 can be flat. By causing a portion of the flexible base material 70 to be thin in the extending direction of the flexible base material 70, it is possible to increase the stretching ratio of a particular region.

Although connection parts where the stretchable wire member is connected to other members, such as a printed wiring board, are the end portions of the hard base materials, where the fixed wires are provided, the connection parts themselves can be the fixed parts 20h that are fixed to the other members, or portions other than the connection parts can be the fixed parts 20h. For example, the fixed parts 20h can be provided at the bulging parts 75. If a structure in which the fixed parts 20h, serving as starting points of stretching, are provided at the bulging parts is used, compared to when the connection parts are fixed for stretching, it is possible to make utmost use of the flexible base material as stretching regions in addition to making it possible to reduce stress that is applied to the boundaries between the connection parts and the flexible base material. The fixed parts 20h that are provided on the outer ends with the flexible wires in between is a desirable mode. If such a structure is used, it is possible to reduce the stress that is applied to the connection parts.

The shape of each hard base material 20 can be a shape in which wide-width parts whose width is wider than the width of the fixed parts 20h are provided at locations beyond the fixed parts 20h in the extending direction and in which the projecting parts 21 are provided at the wide-width parts 21. When such a structure is used, the extending direction and the positions of the projecting parts 21 when the projecting parts 21 are viewed from the fixed parts 20h no longer overlap each other. Therefore, when the stretchable wire member is stretched with the fixed parts 20h as starting points, stress that is transmitted from the fixed parts 20h not only acts on the projecting parts 21 in the extending direction, but also acts on the projecting parts 21 in the in-plane direction. Finally, the projecting parts 21 are caused to be curved to make it possible to reduce the stress in the in-plane direction. Therefore, the stress on the projecting parts 21 is reduced to make it possible to suppress distortion of the flexible base material 70 near stress concentration locations of the flexible base material 70 and the projecting parts 21, and to suppress peeling of the flexible base material 70 and the projecting parts 21.

Although, in the above-described embodiments, the base bodies 10 are described as being provided on two end sides of the stretching body 60, the stretchable wire members 1 to 6 only need to include the stretching body 60 and either one of the base bodies 10. Although embodiments in which the stretchable wire members have a strip shape and are stretched and contracted in one direction in the length direction thereof are described, the stretchable wire members can be formed in a planar shape, such as a rectangular shape, and can be stretched not only in one direction but also in a direction crossing the one direction. In this case, a structure in which flexible wires 80 in an X direction and flexible wires 80 in a Y direction are provided on front and back sides of a sheet-like flexible base material 70 is used to make it possible to form a structure in which base bodies 10 are provided on four sides of the sheet.

Figure 12A:
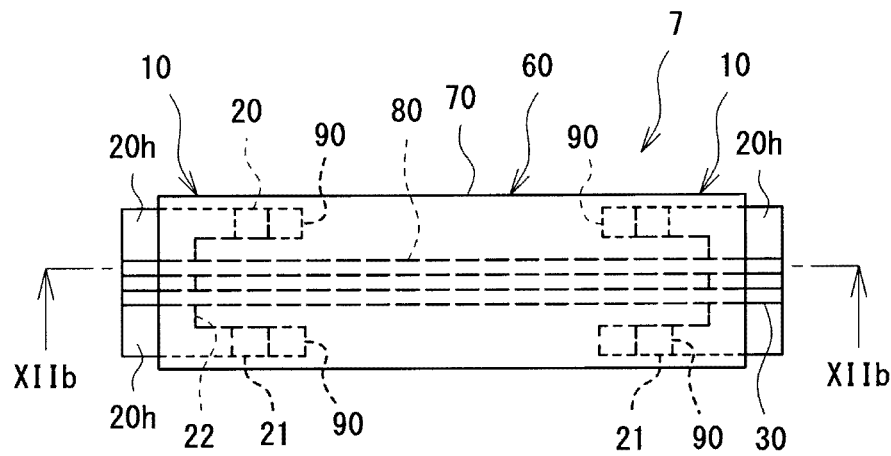
FIG. 12 is an explanatory view of a stretchable wire member of a modification, with FIG. 12(a) being a schematic plan view thereof and FIG. 12(b) being a sectional view along line XIIb-XIIb in FIG. 12(a).
Figure 12B:
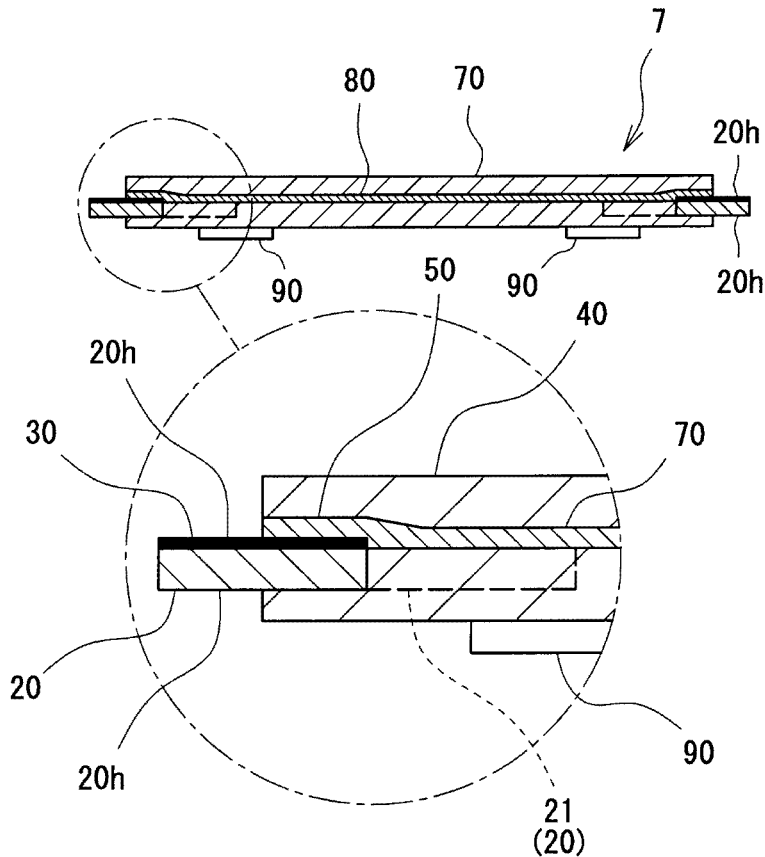

In order to reinforce the boundary between each hard base material 20 and the flexible base material 70, stretching preventing members 90 described next can be further provided. A stretchable wire member 7 including the stretching preventing members 90 is shown in FIG. 12. The stretching preventing members 90 can be provided at positions in correspondence with the boundaries between the flexible base material 70 and the distal ends T of the projecting parts 21 of the hard base materials 20 in plan view. It is desirable that each stretching preventing member 90 be made of a material that is as hard as or harder than the flexible base material 70 and that is softer than the hard base materials 20. As the material of the stretching preventing members 90, a material that is the same as the material of the hard base materials 20 and that has its hardness adjusted or a material that is the same as the material of the flexible base material 70 and that has its hardness adjusted can be used. When elastomer or rubber that is the same as those used for the flexible base material 70 is used, the hardness is easily adjusted. When the stretching preventing members 90 are made of a material having the same hardness as the flexible base materials 20, each stretching preventing member 90 can be one in which a part of the flexible base material 70 protrudes outward.

Figure 13:
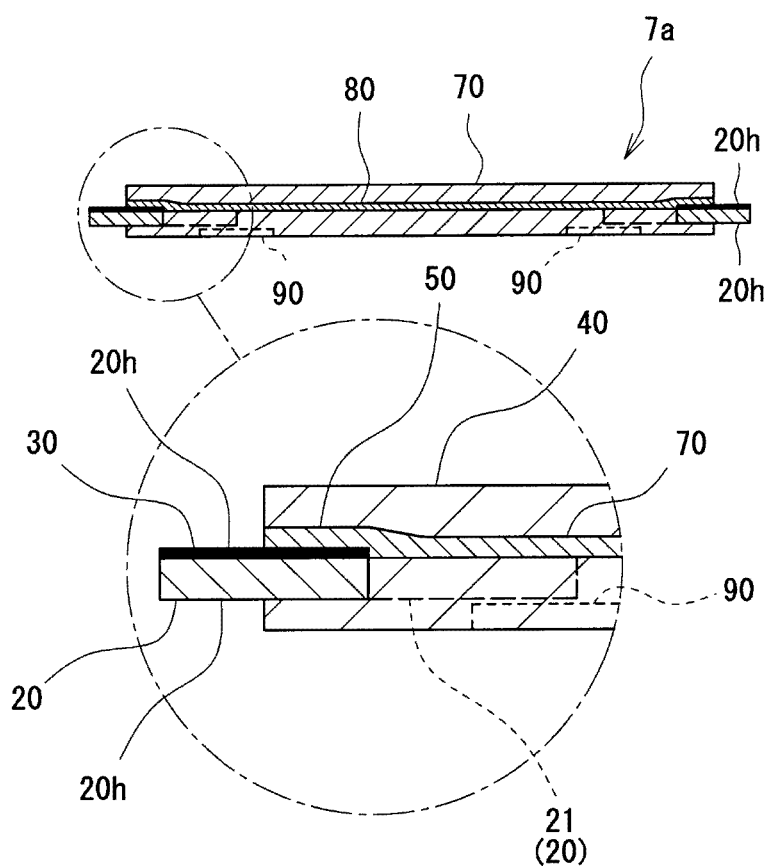
FIG. 13 is a sectional view, corresponding to FIG. 12(b), of a stretchable wire member of a different modification.

The stretching preventing members 90 can also be provided on the inner sides of the flexible base material 70. FIG. 13 shows a stretchable wire member 7a in which the stretching preventing members 90 are provided on the inner sides of the flexible base material 70. It is desirable that the stretching preventing members 90 in this case be made of a material that is harder than the flexible base material 70 and softer than the hard base materials 20. That a material that is the same as the material of the hard base materials 20 and that has its hardness adjusted or a material that is the same as the material of the flexible base material 70 and that has its hardness adjusted can be used is the same as the case shown in FIG. 12.

EXAMPLES

Samples 1 to 16 are manufactured stretchable wire members having the shapes shown in FIGS. 10(*a*) to 10(*o*), and various tests were performed on Samples 1 to 16 to observe their stretching characteristics.

In addition, Samples 17 and 18 are manufactured stretchable wire members having the shapes shown in FIGS. 11 and 12, and various tests were performed on the Samples 17 and 18 to observe their stretching characteristics.

<Manufacturing of Sample 1>:

Sample 1 is the manufactured stretchable wire member having the shape shown in FIG. 10(*a*). More specifically, two fixed wires having a width of 1 mm were formed by printing by performing copper plating on an upper surface of a hard base material made of a glass epoxy resin film and having a length of 15 mm, a width of 15 mm, and a thickness of 0.1 mm. On the other hand, two flexible base materials made of silicone rubber and having a length of 25 mm, a width of 20 mm, a thickness of 0.5 mm, and a rubber hardness of A30 based on JIS K6253 were prepared, and flexible wires made of silver paste, in which silver powder was dispersed in liquid silicone, and having a width that was the same as the width of the fixed wires were formed on one of the flexible base materials by printing. Then, from end portions on the side of a stretching body to a position of 10 mm towards the opposite side, the hard base material was sandwiched by the two flexible base materials to press and integrate them, as a result of which the stretchable wire member of Sample 1 was obtained.

<Manufacturing of Samples 2 to 16>:

Similarly to Sample 1, the stretchable wire members of Samples 2 to 15 having the corresponding shapes shown in FIGS. 10(*b*) to 10(*o*) and Sample 16 having the shape shown in FIG. 10(*a*) were obtained. Samples 2 to 16 are samples in which changes described below were made to Sample 1.

Sample 2 has the shape shown in FIG. 10(*b*), and the shape is one in which a distal end of the hard base material is obliquely formed. The difference between the projecting lengths, that is, the difference between the length of a side surface of the hard base material having the shorter length and the length of a side surface of the hard base material having the longer length is 5 mm.

Sample 3 has the shape shown in FIG. 10(*c*), and has a structure in which a projecting part including the fixed wires is provided in the center of the hard base material and the flexible wires are extended to the flexible base material via the projecting part. The projecting part has a width of 5 mm and a length of 5 mm.

Sample 4 has the shape shown in FIG. 10(*d*), and has a structure in which a pair of projecting parts projecting towards the flexible base material from an end portion of the hard base material are formed at an outer portion of the hard base material, and the flexible wires are extended to the flexible base material at a location interposed between the projecting parts. A bulging part where the flexible base material bulges is provided on an outer side of the hard base material opposite to the central portion where the flexible wires are provided. The shape of each projecting part has a width of 5 mm and a length of 5 mm. The width of a portion between the projecting parts, or the width of this portion that becomes a recessed part is also 5 mm.

Sample 5 has the shape shown in FIG. 10(*e*), and has the same structure as Sample 4 in which a pair of projecting parts projecting towards the flexible base material from an end portion of the hard base material are formed at an outer portion of the hard base material, and the flexible wires are extended to the flexible base material at a location interposed between the projecting parts. On the other hand, Sample 5 has a structure in which by changing the width of the flexible base material to 15 mm, a bulging part is not provided.

Sample 6 has the shape shown in FIG. 10(*f*), and the shape is one in which with respect to Sample 4 the width from the hard base material is reduced by 2.5 mm from each end. In other words, the shape of each projecting part has a width of 2.5 mm and a length of 5 mm. The width of the bulging part is 5 mm.

Sample 7 has the shape shown in FIG. 10(*g*), and the shape is one in which a projecting part is provided on only one side whereas two projecting parts are provided in Sample 4. The size of the projecting part is the same as the size of one projecting part of Sample 4.

Sample 8 has the shape shown in FIG. 10(*h*), and has a structure in which projecting parts having inclined surfaces extending towards outer portions from the center of the hard base material are provided. The difference between the projecting lengths, that is, the difference between the length of a central portion of the hard base material where its length is shortest and the length of two side surfaces of the hard base material where its length is longest is 5 mm.

Sample 9 has the shape shown in FIG. 10(*i*), and is one in which although a pair of projecting parts are provided at outer portions of the hard base material as in Sample 4, the width of distal end portions thereof is reduced and side surfaces extending to the distal end portions from a recessed part in the center are inclined surfaces. The width of each distal end portion is 2.5 mm. The width of a portion between the projecting parts that becomes a recessed part is the same as that in Sample 4.

Sample 10 has the shape shown in FIG. 10(*j*), and is similar to Sample 4 in the outer shape of the hard base material but differs from Sample 4 in that through holes having a diameter of 2 mm are provided in central portions of corresponding projecting parts that are provided on outer portions. Sample 10 has a structure in which the upper and lower flexible base materials are fixed inside the through holes.

Sample 11 has the shape shown in FIG. 10(*k*), and has a structure in which although a pair of projecting parts are provided at outer portions of the hard base material as in Sample 4, the projecting parts have inclined surfaces from distal-end inner corner parts thereof to the outer sides. The projecting lengths, that is, the lengths to the distal-end inner corner parts, which are apexes, from proximal ends of the projecting parts are 5 mm, and the width between the projecting parts at base portions, which are wider toward an end due to the inclined surfaces, is 5 mm.

Sample 12 has the shape shown in FIG. 10(*l*) and is a sample in which although a pair of projecting parts are provided at outer portions of the hard base material as in Sample 4, corners of distal-end inner corner parts and corners of distal-end outer corner parts have round shapes. The round portion of each corner part is an arc having a radius of 2 mm.

Sample 13 has the shape shown in FIG. 10(*m*), and is a sample in which although a pair of projecting parts are provided at outer portions of the hard base material as in Sample 4, the width of half-way portions of the projecting parts excluding the distal ends is small. Specifically, the width to a location that is 1 mm from the distal end of each projecting part is 5 mm, and the width of a portion that is 1 to 5 mm from each distal end is 3 mm.

Sample 14 has the shape shown in FIG. 10(*n*), and is a sample in which although a pair of projecting parts are provided at outer portions of the hard base material as in Sample 4, the width of a fixed part that is an end portion opposite to the projecting parts is reduced to 5 mm.

Sample 15 has the shape shown in FIG. 10(*o*), and is a sample having the same shape as Sample 14 in plan view, but has a structure in which the wall thickness of a central portion of the flexible base material on a surface side where the flexible wires are provided is large. Specifically, the wall thickness of the central portion of the flexible base material is 1 mm thicker over a width of 5 mm.

Figure 1B:
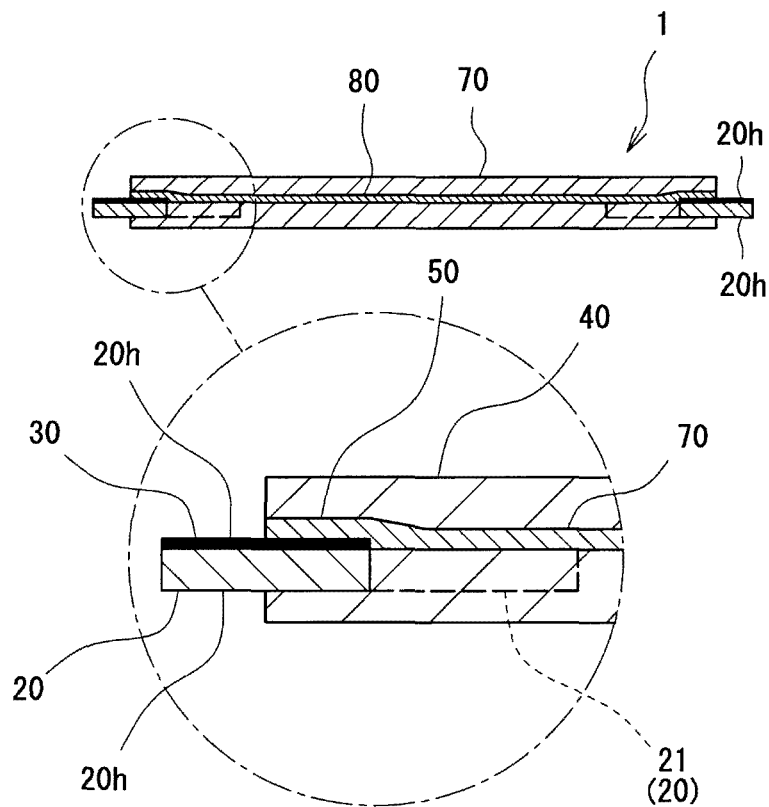
Figure 2A:
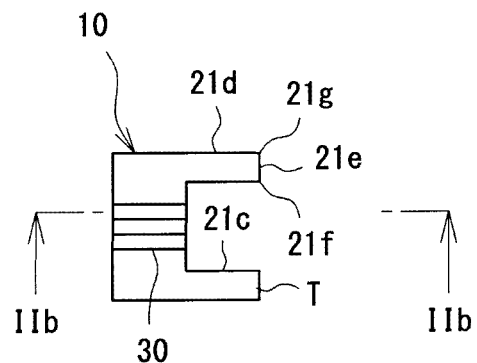
FIG. 2 is an explanatory view of a base body that constitutes the stretchable wire member in FIG. 1, with FIG. 2(a) being a schematic plan view thereof and FIG. 2(b) being a sectional view along line IIb-IIb in FIG. 2(a).
Figure 2B:
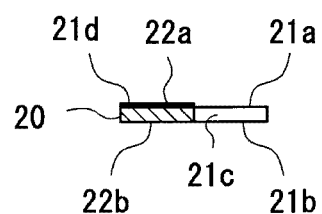

Although Sample 16 has an outer shape that is the same as Sample 1 shown in FIG. 1(*a*) in plan view, Sample 16 has a structure in which a flexible base material is only provided on one side.

The shapes and features of Sample 1 to Sample 16 above and the test results described below are summarized and indicated in the following Tables 1 and 2.

TABLE 1

|  | SAMPLE 1 | SAMPLE 2 | SAMPLE 3 | SAMPLE 4 | SAMPLE 5 | SAMPLE 6 | SAMPLE 7 | SAMPLE 8 |
|---|---|---|---|---|---|---|---|---|
| FRONT, BACK COVERING | ○ | ○ | ○ | ○ | ○ | ○ | ○ | ○ |
| PROJECTING PARTS | x | Δ(○) | x | ○ | ○ | ○ | ○ | ○ |
| BULGING PART | ○ | ○ | ○ | ○ | x | ○ | ○ | ○ |
| POSITION OF FIXED PART | ENTIRE WIDTH OF BASE BODY | ENTIRE WIDTH OF BASE BODY | ENTIRE WIDTH OF BASE BODY | ENTIRE WIDTH OF BASE BODY | ENTIRE WIDTH OF BASE BODY | ENTIRE WIDTH OF BASE BODY | ENTIRE WIDTH OF BASE BODY | ENTIRE WIDTH OF BASE BODY |
| PROJECTING PARTS HAVE WIDENING SHAPE | x | x | x | x | x | x | x | ○ |
| PROJECTING PARTS PROVIDED AT WIDE-WIDTH PART | x | x | x | x | x | x | x | x |
| STRETCHING RATIO (%) AT THE TIME OF WIRE BREAKAGE | 194 | 456 | 176 | 358 | 380 | 425 | 396 | 460 |
| STRETCHING RATIO (%) NEAR BOUNDARY PORTION (WHEN STRETCHING LENGTH IS 300%) | 333 | 200 | 333 | 113 | 113 | 113 | 139 | 208 |
| STRESS CONCENTRATION LOCATION | OUTER SIDE OF BOUNDARY | BOTH ENDS OF BOUNDARY | CORNER OF BOUNDARY PROTRUSION | OUTER CORNER PARTS OF PROJECTING PARTS | OUTER CORNER PARTS OF PROJECTING PARTS | OUTER CORNER PARTS OF PROJECTING PARTS | INNER CORNER PARTS OF PROJECTING PARTS | OUTER CORNER PARTS OF PROJECTING PARTS |

TABLE 1-continued

|  | SAMPLE 1 | SAMPLE 2 | SAMPLE 3 | SAMPLE 4 | SAMPLE 5 | SAMPLE 6 | SAMPLE 7 | SAMPLE 8 |
|---|---|---|---|---|---|---|---|---|
| STRETCHING RATIO (%) NEAR STRESS CONCENTRATION LOCATION (WHEN STRETCHING LENGTH IS 300%) | 344 | 233 | 333 | 344 | 350 | 294 | 281 | 346 |
| OCCURRENCE OF PEELING | 3 | 2 | 2 | 3 | 2 | 3 | 4 | 3 |

TABLE 2

|  | SAMPLE 9 | SAMPLE 10 | SAMPLE 11 | SAMPLE 12 | SAMPLE 13 | SAMPLE 14 | SAMPLE 15 | SAMPLE 16 |
|---|---|---|---|---|---|---|---|---|
| FRONT, BACK COVERING | ○ | ○ | ○ | ○ | ○ | ○ | ○ | x |
| PROJECTING PARTS | ○ | ○ | ○ | ○ | ○ | ○ | ○ | x |
| BULGING PART | ○ | ○ | ○ | ○ | ○ | ○ | ○ | ○ |
| POSITION OF FIXED PART | ENTIRE WIDTH OF BASE BODY | ENTIRE WIDTH OF BASE BODY | ENTIRE WIDTH OF BASE BODY | ENTIRE WIDTH OF BASE BODY | ENTIRE WIDTH OF BASE BODY | CENTER OF BASE BODY | CENTER OF BASE BODY | ENTIRE WIDTH OF BASE BODY |
| PROJECTING PARTS HAVE WIDENING SHAPE | ○ | x | x | Δ | x | x | x | x |
| PROJECTING PARTS PROVIDED AT WIDE-WIDTH PART | x | x | x | x | x | ○ | ○ | x |
| STRETCHING RATIO (%) AT THE TIME OF WIRE BREAKAGE | 435 | 411 | 392 | 423 | 383 | 439 | 442 | 376 |
| STRETCHING RATIO (%) NEAR BOUNDARY PORTION (WHEN STRETCHING LENGTH IS 300%) | 167 | 113 | 113 | 122 | 100 | 100 | 100 | 125 |
| STRESS CONCENTRATION LOCATION | OUTER CORNER PARTS OF PROJECTING PARTS | OUTER CORNER PARTS OF PROJECTING PARTS | APEXES OF PROJECTING PARTS | APEXES OF ARCS OF PROJECTING PARTS | OUTER CORNER PARTS OF PROJECTING PARTS | INNER CORNER PARTS OF PROJECTING PARTS | INNER CORNER PARTS OF PROJECTING PARTS | OUTER CORNER PARTS OF PROJECTING PARTS |
| STRETCHING RATIO (%) NEAR STRESS CONCENTRATION LOCATION (WHEN STRETCHING LENGTH IS 300%) | 344 | 344 | 280 | 366 | 346 | 300 | 333 | 300 |
| OCCURRENCE OF PEELING | 3 | 3 | 4 | 4 | 4 | 5 | 5 | 1 |

<Manufacturing of Samples 17 and 18>:

Similarly to Sample 4, the stretchable wire members of Samples 17 and 18 shown in corresponding FIGS. 11 and 12 were obtained. Samples 17 and 18 are samples to which changes described below were made to Sample 4.

Sample 17 is a sample that uses a hard base material in which a central projecting part is provided between two projecting parts on outer sides, the central projecting part projecting more than the two projecting parts.

Sample 18 is a sample in which a stretching preventing member is further provided to Sample 5.

The shapes and features of Samples 17 and 18 above and the test results described below are summarized and indicated in the next Table 3.

were increased to three times the initial length were measured. The results of measurement are given in the "stretching ratio (%) near stress concentration location (when stretching length is 300%)" row. Further, in the tensile tests, locations where stress was concentrated when the lengths were increased to three times the initial length were observed. The locations where stress was concentrated are given in the "stress concentration location" row. In the present invention, the stretching ratio (%) is a length in % of a predetermined region after the stretchable wire members have been stretched with respect to the initial length of the predetermined region, and when, for example, the length of the predetermined region became three times the initial length, the stretching ratio was expressed as 300%.

TABLE 3

| | SAMPLE 17 | SAMPLE 18 |
|---|---|---|
| FRONT, BACK COVERING | ○ | ○ |
| PROJECTING PARTS | ○ | ○ |
| BULGING PART | ○ | ○ |
| POSITION OF FIXED PART | ENTIRE WIDTH OF BASE BODY | ENTIRE WIDTH OF BASE BODY |
| WIDENING SHAPE OF PROJECTING PARTS | x | x |
| PROJECTING PARTS PROVIDED AT WIDE-WIDTH PART | x | x |
| STRETCHING RATIO (%) AT THE TIME OF WIRE BREAKAGE | 383 | 396 |
| STRETCHING RATIO (%) NEAR BOUNDARY PORTION (WHEN STRETCHING LENGTH IS 300%) | 113 | 125 |
| STRESS CONCENTRATION LOCATION | BOTH CORNER PARTS OF CENTER PROJECTING PART | OUTER CORNER PARTS OF PROJECTING PARTS |
| STRETCHING RATIO (%) NEAR STRESS CONCENTRATION LOCATION (WHEN STRETCHING LENGTH IS 300%) | 366 | 267 |
| OCCURRENCE OF PEELING | 3 | 5 |

<Various Tests>:

Various tests described next were performed on the stretchable wire members of Samples 1 to 16 above and Samples 17 and 18 above.

Breakage Test: The end portions of hard base materials exposed at two ends of the stretchable wire members of Samples 1 to 16 and Samples 17 and 18 were fixed to a tensile testing machine, and were pulled at a tensile speed of 25 mm/min in a length direction of conductive wires to measure the stretching ratio (%) when the stretchable wire members broke. In addition, the "stretching ratio (%) at the time of wire breakage" row gives the stretching ratios (%) from the initial length when the stretchable wire members were stretched and broke. When the length was equal to the initial length, the stretching ratio was 100%.

Tensile tests: In the tensile tests, stretching ratios (%) near portions closer to the stretching body than the boundary between the base body and the stretching body, where the conductive wires were provided, were measured when each of the stretchable wire members was pulled under the same conditions as the conditions of the breakage tests and the interval between the distal ends of the two projecting parts formed on the hard base materials (the distal ends of the hard base materials for samples not having projecting parts) was increased in length by three times the initial length. The results of measurement are given in the "stretching ratio (%) near boundary portion (when stretching length is 300%)" row. In addition, in the tensile tests, stretching ratios (%) near the distal ends of the projecting parts when the lengths Tables 1 and 2 and Table 3 give the following items in addition to those described above. The "front, back covering" row indicates whether or not the base-material-side flexible base material covered the upper and lower surface of the hard base material, and when the base-material-side flexible base material covered both the upper and lower surfaces, the result was "○", whereas when a base-material-side flexible base material was not provided at the lower surface, the result was "x". The "projecting parts" row indicates whether or not the hard base material had projecting parts, and when both outer sides of the hard base material were provided with projecting parts, the result was "○", whereas when either one of the outer sides was provided with a projecting part, the result was "Δ", or when a projecting part or projecting parts were not provided, the result was "x".

The "bulging part" row indicates whether or not a bulging part where the base-body-side flexible base material positioned at an outer side with respect to the hard base material was provided, and when a bulging part was provided, the result was "○", whereas when a bulging part was not provided, the result was "x". The "position of fixed part" row indicates a portion where the base bodies at two ends were fixed and held when the stretchable wire member of each sample was stretched, and when the width of a portion of each hard base material that was not covered by the base-body-side flexible base material was equal to the entire width of each hard base material, the result was "entire width of base body", whereas when the width of a central portion of each hard base material that was not covered by the base-body-side flexible base material was less than the entire width of each hard base material, the result was "center of base body".

The "projecting parts have widening shape" row indicates whether or not the shape of the projecting part or the projecting parts was a shape whose perpendicular distance from the flexible wires became larger with decreasing distance from the distal end, and when the shape widened towards the outer side with decreasing distance from the distal end, the result was "○", whereas when the shape could not be said to be a shape that widened towards the outer side with decreasing distance from the distal end, the result was "x" or when the distal end had an arcuate shape, the result was "Δ". The "projecting parts provided at wide-width part" row indicates whether or not the width of the end portion of each hard base material on a side opposite to a connection side where the corresponding hard base material was connected to the stretching body was smaller than or equal to the width of the corresponding projecting parts, and when the width was smaller, the result was "○", whereas when the width was equal, the result was "x".

The "occurrence of peeling" row indicates whether or not cracks, peeling, or other changes occurred in the flexible base material, and when cracks occurred in the flexible base material and peeling having a size of 1 mm or greater occurred, the result was "1". When peeling having a size of 0.5 mm or greater and less than 1 mm occurred, the result was "2"; when peeling having a size of 0.3 mm or greater and less than 0.5 mm occurred, the result was "3", when peeling having a size of 0.1 mm or greater and less than 0.3 mm occurred, the result was "4", and when peeling having a size less than 0.1 mm occurred, the result was "5".

<Review>:

The tests above can be described as follows.

In Sample 1, breakage occurred in the flexible wires at the boundary portion at a stretching ratio of 194%. On the other hand, although the stress concentration location was at the outer corner part, the peeling was moderate. In Sample 2, although wire breakage occurred at a stretching ratio of 456%, stretching of the boundary portion was suppressed, and the wire breakage occurred near the center of the flexible base material. On the other hand, the stress concentration location was at the outer corner part of the projecting part and the peeling was somewhat large in size. The stretching ratio when wire breakage occurred in Sample 3 was 176%, which was the smallest. This may be because, since the stress concentration location is the entire boundary portion at the center, and the stress concentration location and the flexible wires overlap each other, the tendency with which wire breakage occurs is very high. Peeling at the stress concentration location was larger in size than that of Sample 1. Although in Sample 4 wire breakage occurred at a stretching ratio of 358%, stretching of the boundary portion was suppressed, and the wire breakage occurred near the center of the flexible base material. The stress concentration location was at the outer corner part of each projecting part and the peeling was moderate.

Although in Sample 5 wire breakage occurred at a stretching ratio of 380%, stretching of the boundary portion was suppressed, and the wire breakage occurred near the center of the flexible base material. The stress concentration location was at the outer corner part of each projecting part and the peeling was somewhat large in size. This may be because, since, compared to Sample 4 using a connection substrate of the same shape, Sample 5 does not include a bulging part, the effect of suppressing peeling is somewhat small. Although in Sample 6 wire breakage occurred at a stretching ratio of 425%, stretching of the boundary portion was suppressed, and the wire breakage occurred near the center of the flexible base material. The stress concentration location was at the outer corner part of each projecting part and the peeling was moderate. Although in Sample 7 wire breakage occurred at a stretching ratio of 396%, stretching of the boundary portion was suppressed, and the wire breakage occurred near the center of the flexible base material. The stress concentration location was at the inner corner part of the projecting part and the peeling was somewhat small in size. Although in Sample 8 wire breakage occurred at a stretching ratio of 460%, stretching of the boundary portion was suppressed, and the wire breakage occurred near the center of the flexible base material. The stress concentration location was at the outer corner part of each projecting part and the peeling was moderate.

Although in Sample 9 wire breakage occurred at a stretching ratio of 435%, stretching of the boundary portion was suppressed, and the wire breakage occurred near the center of the flexible base material. The stress concentration location was at the outer corner part of each projecting part and the peeling was moderate. Although in Sample 10 wire breakage occurred at a stretching ratio of 411%, stretching of the boundary portion was suppressed, and the wire breakage occurred near the center of the flexible base material. The stress concentration location was at the outer corner part of each projecting part and the peeling was moderate. Although in Sample 11 wire breakage occurred at a stretching ratio of 392%, stretching of the boundary portion was suppressed, and the wire breakage occurred near the center of the flexible base material. The stress concentration location was at the apex of each projecting part and the peeling was somewhat small in size. Although in Sample 12 wire breakage occurred at a stretching ratio of 423%, stretching of the boundary portion was suppressed, and the wire breakage occurred near the center of the flexible base material. The stress concentration location was near the apex of the arc of each projecting part and the peeling was somewhat small in size.

Although in Sample 13 wire breakage occurred at a stretching ratio of 383%, stretching of the boundary portion was suppressed, and the wire breakage occurred near the center of the flexible base material. The stress concentration location was at the outer corner part of each projecting part and the peeling was somewhat small in size. Although in Sample 14 wire breakage occurred at a stretching ratio of 439%, stretching of the boundary portion was suppressed, and the wire breakage occurred near the center of the flexible base material. The stress concentration location was at the inner corner part of each projecting part, and almost no peeling was observed. When the stretchable wire member was stretched, the entire stretchable wire member was curved. Although in Sample 15 wire breakage occurred at a stretching ratio of 442%, stretching of the boundary portion was suppressed, and the wire breakage occurred near the center of the flexible base material. The stress concentration location was at the inner corner part of each projecting part, and almost no peeling was observed. When the stretchable wire member was stretched, the entire stretchable wire member was curved. Although in Sample 16 wire breakage occurred at a stretching ratio of 376%, stretching of the boundary portion was suppressed, and the wire breakage occurred near the center of the flexible base material. The stress concentration location was at the outer corner part. In the present form, peeling having a considerably large size was observed not only at the boundary portion but also up to the upper surface of the projecting parts.

Although in Sample 17 wire breakage occurred at a stretching ratio of 383%, stretching of the boundary portion between the flexible base material and each hard base material was suppressed, and the wire breakage occurred near the center of the flexible base material. The stress concentration location was at the corner parts on two sides of the center projecting part and the peeling was moderate. On the other hand, peeling of the projecting parts on two ends was suppressed.

Although in Sample 18 wire breakage occurred at a stretching ratio of 396%, stretching of the boundary portion between the flexible base material and each hard base material was suppressed, and the wire breakage occurred near the center of the flexible base material. The stress concentration location was at the corner parts on the outer side with respect to the stretching preventing member, and almost no peeling was observed. The stretching ratio of the flexible base material near the stress concentration location was smaller than the stretching ratio of a structure where the hard base materials were merely provided with projecting parts, and the stretching preventing member, along with the projecting parts, suppress deformation of the flexible base material, so that peeling of the boundary portion between the flexible base materials and each hard base material was made more unlikely.

Accordingly, in Samples 2 and 4 to 15 including projecting parts, the stretching ratio near the boundary portion was 208% at most, and, compared to Samples 1 and 3 not including projecting parts where the stretching ratio near the boundary portion exceeded 300%, the stretching ratio of this portion was small. In Sample 16 in which only the upper surface of each hard base material was covered with the base-body-side flexible base material, although the stretching ratios near the boundary portion and near the stress concentration location were not large, when observing peeling, only the peeling of Sample 16 was evaluated as being 1, which was the worst evaluation result of the evaluation results of all the samples.

In addition, due to Samples 17 and 18, by providing a central projecting part or a stretching prevent member, peeling of the boundary portion between the flexible base material and each hard base material was made more unlikely compared to structures not including these members.

REFERENCE SIGNS LIST

1~5 (5a~5o), 6, 7, 7a stretchable wire member
10 base body
10c inner side
10d outer side
20 hard base material
20a upper surface
20b lower surface
20h fixed part
21 projecting part
21a upper surface
21b lower surface
21c inner side surface
21d outer side surface
21e distal-end side surface
21f distal-end inner corner part
21g distal-end outer corner part
T distal end (distal end of projecting part)
22 recessed part
22a upper surface
22b lower surface
23 outer portion
24 central projecting part
30 fixed wire (conductive wire)
40 base-body-side flexible base material
50 base-body-side flexible wire (conductive wire)
60 stretching body
70 flexible base material
75 bulging part
80 flexible wire (conductive wire)
90 stretching preventing member
F stress

The invention claimed is:

1. A stretchable wire member comprising:
a base body in which a fixed wire is formed on a hard base material; and
a stretching body in which flexible wires are formed at a flexible base material,
wherein, in the stretchable wire member in which the base body and the stretching body are fixed and connected to each other,
the hard base material includes a first projecting part that reduces concentration of stress that is generated at a boundary between the base body and the stretching body, and
the first projecting part is located between flexible wires.

2. The stretchable wire member according to claim 1, wherein a front and a back of the flexible wire are covered by the flexible base material, and a rubber hardness of the flexible wire is higher than a rubber hardness of the flexible base material.

3. The stretchable wire member according to claim 1, wherein a fixing strength between the flexible wire and the flexible base material is larger than a tensile rupture force of the flexible wire.

4. The stretchable wire member according to claim 1,
wherein the hard base material includes third projecting parts, and a recessed part which is located between any two of the first projecting part and the third projecting parts.

5. The stretchable wire member according to claim 4, wherein a bulging part is provided on an outer side with respect to a distal end of the third projecting parts, the bulging part being formed from a flexible base material and bulging outward in a direction opposite to a central portion where the flexible wire is provided.

6. The stretchable wire member according to claim 4, wherein the third projecting parts has a shape whose perpendicular distance from the flexible wire becomes larger with decreasing distance from the distal end.

7. The stretchable wire member according to claim 4, wherein a width of an end portion of the hard base material on a side opposite to a connection side where the hard base material is connected to the stretching body is smaller than a width of the third projecting parts.

8. The stretchable wire member according to claim 4, wherein a width of an end portion of the hard base material on a side opposite to a connection side where the hard base material is connected to the stretching body is substantially equal to a width of the third projecting parts.

9. The stretchable wire member according to claim 4,
wherein the flexible base material includes a base-body-side flexible base material which extends from the stretching body and covers an upper surface and a lower surface of any one of the first projecting part and the third projecting parts and an upper surface and a lower surface of the recessed part.

10. A stretchable wire member comprising:
a base body in which a fixed wire is formed on a hard base material; and
a stretching body in which a flexible wire is formed at a flexible base material,
wherein, in the stretchable wire member in which the base body and the stretching body are fixed and connected to each other,
the hard base material includes a second projecting part that reduces concentration of stress that is generated at a boundary between the base body and the stretching body, and an upper surface and a lower surface of the second projecting part and an upper surface and a lower surface of a recessed part surrounded by the second projecting part are covered by a base-body-side flexible base material extending from the stretching body,
wherein the upper surface of the second projecting part of the hard base material has a curved shape that is inclined with respect to an upper surface where the fixed wire is stacked.

11. The stretchable wire member according to claim 10, wherein the hard base material includes third projecting parts, and a recessed part which is located between any two of the second projecting part and the third projecting parts.

12. The stretchable wire member according to claim 11, wherein, of the base-body-side flexible base material, which is a flexible base material that is stacked on the base body, a portion of the flexible base material that is fixed to an upper surface of the hard base material is more flexible that a portion of the flexible base material that is fixed to a lower surface of the hard base material.

13. The stretchable wire member according to claim 11, wherein the flexible base material includes a base-body-side flexible base material which extends from the stretching body and covers an upper surface and a lower surface of any one of the second projecting part and the third projecting parts and an upper surface and a lower surface of the recessed part.

* * * * *